United States Patent [19]

Marceau et al.

[11] 4,085,012

[45] Apr. 18, 1978

[54] METHOD FOR PROVIDING ENVIRONMENTALLY STABLE ALUMINUM SURFACES FOR ADHESIVE BONDING AND PRODUCT PRODUCED

[75] Inventors: J. Arthur Marceau, Seattle; Ralph H. Firminhac; Yukimori Moji, both of Bainbridge Island, all of Wash.

[73] Assignee: The Boeing Company, Seattle, Wash.

[21] Appl. No.: 661,717

[22] Filed: Feb. 26, 1976

Related U.S. Application Data

[63] Continuation of Ser. No. 440,387, Feb. 7, 1974, abandoned.

[51] Int. Cl.² .................... C25D 11/08; C25D 11/18
[52] U.S. Cl. ............... 204/38 A; 204/38 E; 204/58; 156/151; 428/469
[58] Field of Search ............ 204/58, 38 E, 38 A; 156/151; 428/469

[56] References Cited

U.S. PATENT DOCUMENTS

| | | | |
|---|---|---|---|
| 2,036,962 | 4/1936 | Fischer | 204/58 |
| 2,430,468 | 11/1947 | Julich et al. | 204/58 |
| 3,594,289 | 7/1971 | Watkinson et al. | 204/38 A |
| 3,672,972 | 6/1972 | Dorsey | 204/58 |
| 3,734,784 | 5/1973 | Bereday et al. | 204/38 A |
| 3,798,096 | 3/1974 | Grunwald et al. | 156/151 |
| 3,799,848 | 3/1974 | Kolic et al. | 204/58 |
| 3,945,899 | 3/1976 | Nikaido et al. | 428/469 |

OTHER PUBLICATIONS

Surface Treatment of Al by Wernick et al., 3rd Ed., 1964, p. 759.
"The Surface Treatment and Finishing of Al", by Wernick et al., 3rd Ed., 1964, pp. 284–286.
"American Wrought Alloys", Aluminum, S. Wernick, 1964, p. 759.

*Primary Examiner*—R. L. Andrews
*Attorney, Agent, or Firm*—Christensen, O'Connor, Johnson & Kindness

[57] ABSTRACT

Environmentally stable bond joints of aluminum metal and aluminum alloys in adhesively joined structures are formed by utilizing a prebonding anodization of the aluminum surfaces in a phosphoric acid electrolyte containing from about 1.5 to about 50% $H_3PO_4$ at 1 to 50 volts for a period of 5 to 60 minutes using a bath temperature of 50° to 100° F. The anodized surface is then washed free of electrolyte, dried and coated with an adhesive resin. The aluminum metal segments are then arranged in a composite arrangement and bonded together under pressure and heat to cure the adhesive resin. The resulting structure is resistant to failure of the bond joints on exposure to moist atmospheric conditions. The surface preparation provides a hydration resistant aluminum oxide surface which minimizes adhesive-aluminum separation under aqueous exposure. Alloys containing copper and other alloying constituents may be successfully anodized and bonded by this process.

29 Claims, 9 Drawing Figures

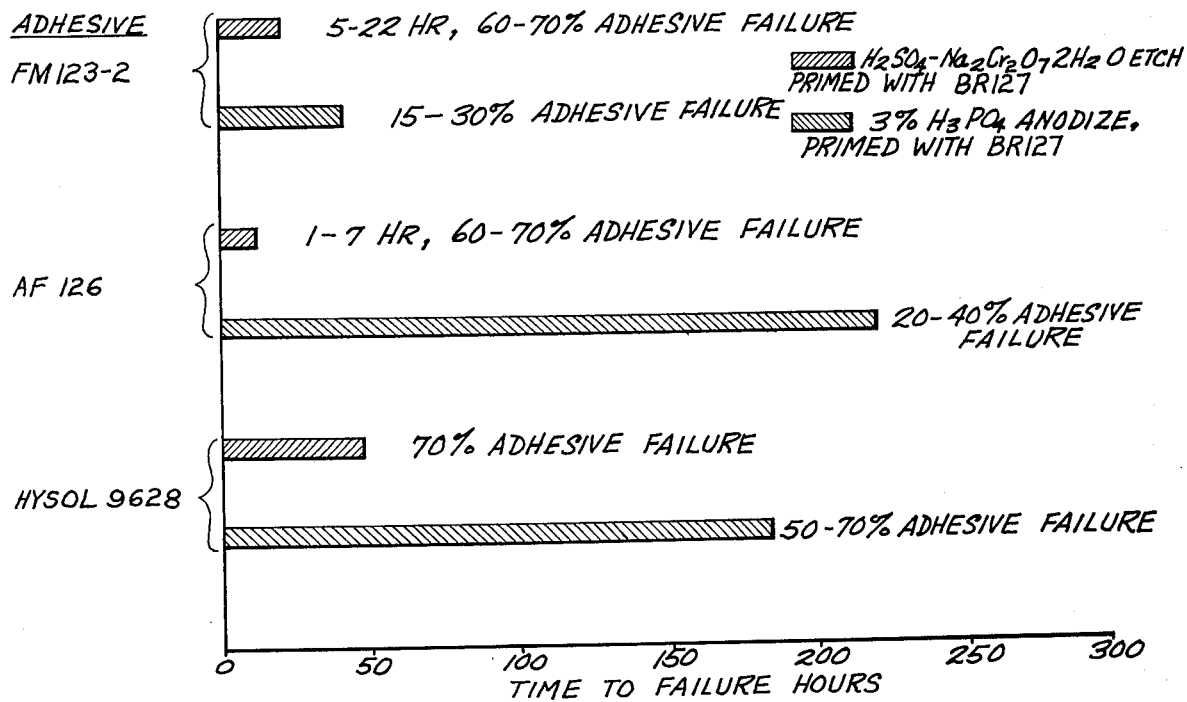
Fig. 3 SUSTAINED STRESS LAP SHEAR TEST DATA OF 7075-T6 CLAD SPECIMENS STRESSED AT 1750 PSI AND IMMERSED IN 3.5% NaCl SOLUTION AT 140°F
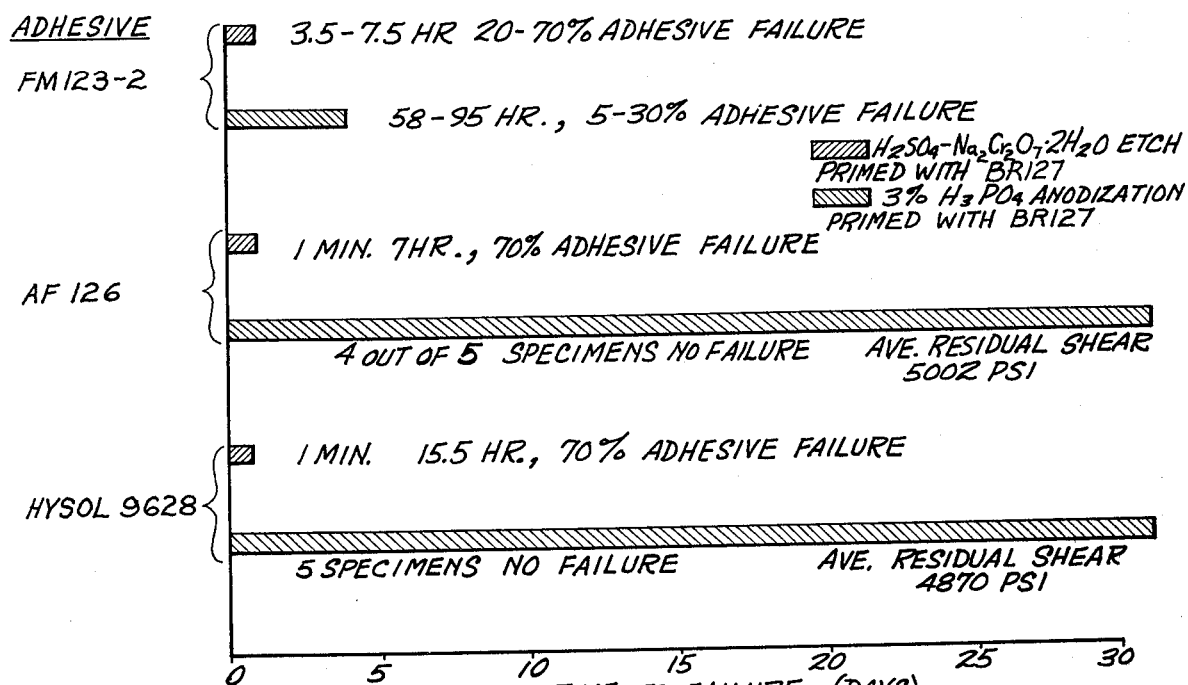
Fig. 4 SUSTAINED STRESS LAP SHEAR TEST DATA OF 7075-T6 CLAD SPECIMENS STRESSED AT 2750 PSI IMMERSED IN 3.5% NaCl AT 75°F a = CRACK LENGTH
Y = DISPLACEMENT

METHOD FOR PROVIDING ENVIRONMENTALLY STABLE ALUMINUM SURFACES FOR ADHESIVE BONDING AND PRODUCT PRODUCED

This is a continuation, divisional of application Ser. No. 440,387, filed Feb. 7, 1974, now abandoned.

BACKGROUND OF THE INVENTION

This invention relates to methods of preparing environmentally stable bonded aluminum structure and more particularly relates to methods of preparing bonded aluminum structures in which the aluminum surface is rendered especially well adapted to receive the adhesive resin and is resistant to subsequent delamination and failure of the adhesive bond at the adhesive resinaluminum interface.

It is well known that aluminum or aluminum alloy surfaces exhibit unpredictable and unreliable adherence to bonding media particularly in moist and salt laden atmospheres. It has been proposed to increase adherence of surface coating such as electroplated metal on aluminum base by means of an anodic treatment in an acid bath and then dissolving a portion of the oxide film in an acid or alkaline bath prior to electroplating. See U.S. Pat. No. 1,971,761. It has also been proposed to electroplate directly over an oxide film produced by anodizing aluminum or aluminum alloys in chromic acid of phosphoric acid solution without intermediate treatment of the oxide film such as is taught in U.S. Pat. Nos. 1,947,981 2,036,962 and 2,095,519. In each of the above-noted patents the aluminum surface is being prepared for electroplating.

Similarly, it has been proposed to form anodic coatings having improved adhesive properties on aluminum surfaces by depositing coatings on the aluminum substrate by subjecting the aluminum article to electrolytic treatment in an aqueous solution of various acids such as phosphoric acid, oxalic acid, sulphuric acid, malonic acid and the like at elevated temperatures for a very short treatment period. Similarly, it is known to treat oxides already formed on an aluminum surface by other means with a phosphate bath electrolysis to render the oxide surface hydration resistant. The elevated temperature phosphoric acid anodization process results in the deposition of an oxide surface characterized as "pseudoboehmite", a highly active form of aluminum oxide. The characteristics of this form of aluminum oxide apparently permit failure within the oxide structure when high stressed under humid conditions. The treatment of existing oxide films with phosphoric acid anodization results in a film which apparently lacks coherency and stability at the oxide-metal interface and as a result is inadequate for the formation of an environmentally stable adhesive bond.

OBJECTS OF THE INVENTION

Accordingly, it is one object of this invention to prepare adhesively bonded aluminum or aluminum alloy structures wherein the adhesive-aluminum interface exhibits environmental stability in an aqueous environment.

It is a further object of this invention to provide a method of forming adhesively bonded aluminum composite type structures in which adhesive failures at the aluminum-adhesive interface are minimized.

It is a still further object of this invention to provide an adhesively bonded aluminum structure wherein the aluminum surface is subjected to a low temperature anodic electrolysis in a dilute phosphoric acid bath under conditions which enhance the formation of an anodic porous coherent oxide while minimizing or eliminating the deposition of aluminum oxide from the electrolyte.

One specific object of this invention is to provide an anodization process which may be used to prepare aluminum alloys containing copper for bonding into a structure which is environmentally stable.

SUMMARY OF THE INVENTION

The structural bonding of metal to metal and composite type assembly widely used in the aircraft industry and elsewhere frequently require a resultant structure which is reasonably resistant to the extremes of atmospheric conditions found in use. For example, in aircraft construction the wing structure utilized in manufacture of large passenger, cargo, and military aircraft, utilize adhesively bonded structures which are subjected to extremes of temperature varying from substantially below zero Farenheit in Arctic areas to temperatures in excess of 150° F. in tropical areas when the aircraft must be exposed to the tropical sun. Aircraft are also exposed to marine environments and other highly corrosive atmospheres. To avoid failures of th aircraft structures as well as to meet the stringent requirements of the military aircraft standards and the standards established by the aircraft industry for commercial passenger and cargo aircraft, bonded metal to metal and composite type assemblies must be able to withstand the environmental conditions to be encountered. Of particular importance is resistance to corrosion and delamination of composite structures occasioned by humid warm environments which attack prior art materials. Heretofore, the adhesively bonded metal-to-metal and composite type assemblies have performed less than satisfactorily due to adhesive failure at the interface between the polymeric adhesive and the aluminum surface, frequently necessitating field repairs and occasionally removal of the aircraft from service so that extensive repairs may be undertaken.

The present invention contemplates the formation of an environmentally stable, oxide coating on the surface of an aluminum object which is well-suited to adhesion by known polymeric adhesives and resulting in an adhesively bonded structure which upon exposure to severe environments maintains its structural integrity. When highly stressed under severe test conditions, the resultant structure predominantly exhibits cohesive failure within the adhesive layer rather than adhesive failure at the adhesive-metal interface. The aluminum is prepared by a surface treatment to form a porous anodic oxide coating using a phosphoric acid electrolyte maintained at a temperature in the range of 50° to 100° F. while imposing a potential of from about 3 to about 25 volts for a period of about 10 to 30 minutes.

The above-noted processing parameters for the anodizing step are suitable for anodization of both aluminum alloys and relatively pure aluminum metal commonly employed in adhesive bonded structures. The higher range of temperatures, i.e., in the range of about 65° F to 95° F are best employed with aluminum alloys of high aluminum content and for pure or nearly pure aluminum metal. The higher temperature range noted is less satisfactory for aluminum alloys having substantial amounts of other metals therein such as 7075-T6, 2024-T3 and other aluminum alloy materals widely used in industry. For these materials the preferred temperature range is from about 50° F to about 85° F. Similarly for plated and clad alloy aluminum sheet the higher temperature ranges are preferred.

Anodizing under the conditions disclosed herein consistently produces a surface superior in performance to that produced by conventional industry standard methods, such as chromic acid anodizing or sulphuric acid-sodium dichromate etch. This superior performance is clearly demonstrated by the bond stability test shown in FIG. 8 while exposing the specimen to different water and salt environments. Conventionally processed 7075-T6 aluminum clad bondements prepared by chromic acid anodization fail at the oxide-primer interface within two to three days when exposed under stress to hot humid conditions. The same alloy, phosphoric acid anodized prior to bonding under the preferred anodization parameters set forth below does not show any evidence of interfacial failure after exposure to the same environmental conditions for more than 7 months. Typical failure modes of specimens prepared with the production parameters noted above are cohesive, i.e., the specimens fail in the resin adhesive zone rather than at the adhesive-metal interface. Thus, interfacial failure modes which typify service failures are eliminated or at least minimized with this method of aluminum prebond phosphoric acid anodization surface preparation.

Hydration resistance of oxides formed by anodization in phosphoric acid appear to be a significant factor associated with the improvement in bond stability and their low reactivity to water. The applicants postulate that bonds of aluminum to adhesives which are exposed to water and then torn apart at the adhesive-metal interface are in reality cohesive failures within the oxide suggesting that most bond failures exhibiting adhesive failure after exposure to water are due to weakening in the oxide by hydration. The applicants further postulate that the failure mechanism associated with adhesive appearing failures of bonded structure are due to weakening of the oxide by hydration resulting in delamination when the bond is stressed. Once delamination occurs, corrosion can then take place in the delaminated area causing additional damage to the bonded structure. The applicants have found that phosphoric acid anodization of the surface of aluminum metal and alloys using relatively low temperatures and dilute phosphoric acid electrolytes eliminates the delaminating mechanism and subsequent corrosion.

The most significant aspects of low voltage anodization in phosphoric acid of aluminum surfaces prior to adhesive bonding are that the process provides positive control of the oxide formation and therefore high reliability, thus producing an oxide with desirable physical characteristics which are more stable in the presence of water than are other anodically formed or deposited oxides. The process provides a range of anodizing conditions in which both relatively pure aluminum metal and aluminum alloys commonly used for bonding can be anodized, i.e., 2024-T3 aluminum alloy and 7075-T6 aluminum alloy as well as those alloys of a higher aluminum content. The process is also well suited to treatment of clad aluminum material.

Temperatures in excess of about 100° F in solutions of phosphoric acid cause the dissolution rate of the oxide layer to exceed the rate at which it is formed so that the oxide surface is removed. Substantial amounts of aluminum present in the phosphoric acid electrolyte solution, may cause a deposition of aluminum oxide in another form such as that designated "pseudoboehmite" in U.S. Pat. No. 3,672,972 and U.S. Pat. No. 3,714,001. The conditions under which this "pseudoboehmite" deposition occurs and under which the applicants discovery of the environmentally stable oxide film formed under the conditions taught herein varies with the temperature, acid concentration and aluminum concentration. Generally, phosphoric acid anodization at temperatures above about 100° F according to the teaching of U.S. Pat. 3,672,972 and 3,714,001, result in the deposition of "pseudoboehmite" while the phosphoric acid anodization at temperatures below about 100° F result in the applicants' aluminum oxide described herein. At lower temperatures substantial quantities of aluminum may be present in the phosphoric acid electrolyte without causing deposition of "pseudoboehmite". Under the processing conditions set forth below a columnar-type closely adherent aluminum oxide film is formed by oxidation of the surface of the aluminum or aluminum alloy. This film has a thickness varying from 500 to 6,000 Angstroms with pores having a diameter in the range of 300 to 600 Angstroms and a depth of about 400 to 5,500 Angstroms extending into the film. These pores provide many additional locations for bonding by providing more surface area and a mechanical interlock between the adhesive and the aluminum oxide.

The above-noted objectives of this invention and the features discussed briefly in the summary of this invention will become more readily apparent from a detailed examination of the following discussion of the preferred embodiments with reference to the attached drawings.

BRIEF DESCRIPTION OF THE DRAWINGS

FIG. 3 is a graph showing sustained stress lap shear test data for bonded structures prepared by one process of FIG. 1 as compared to bonded structures prepared by the process of FIG. 2;

FIG. 4 is a graph similar to FIG. 3 for tests conducted at a lower temperature;

DETAILED DESCRIPTION OF THE DRAWINGS

Figures 1, 2:
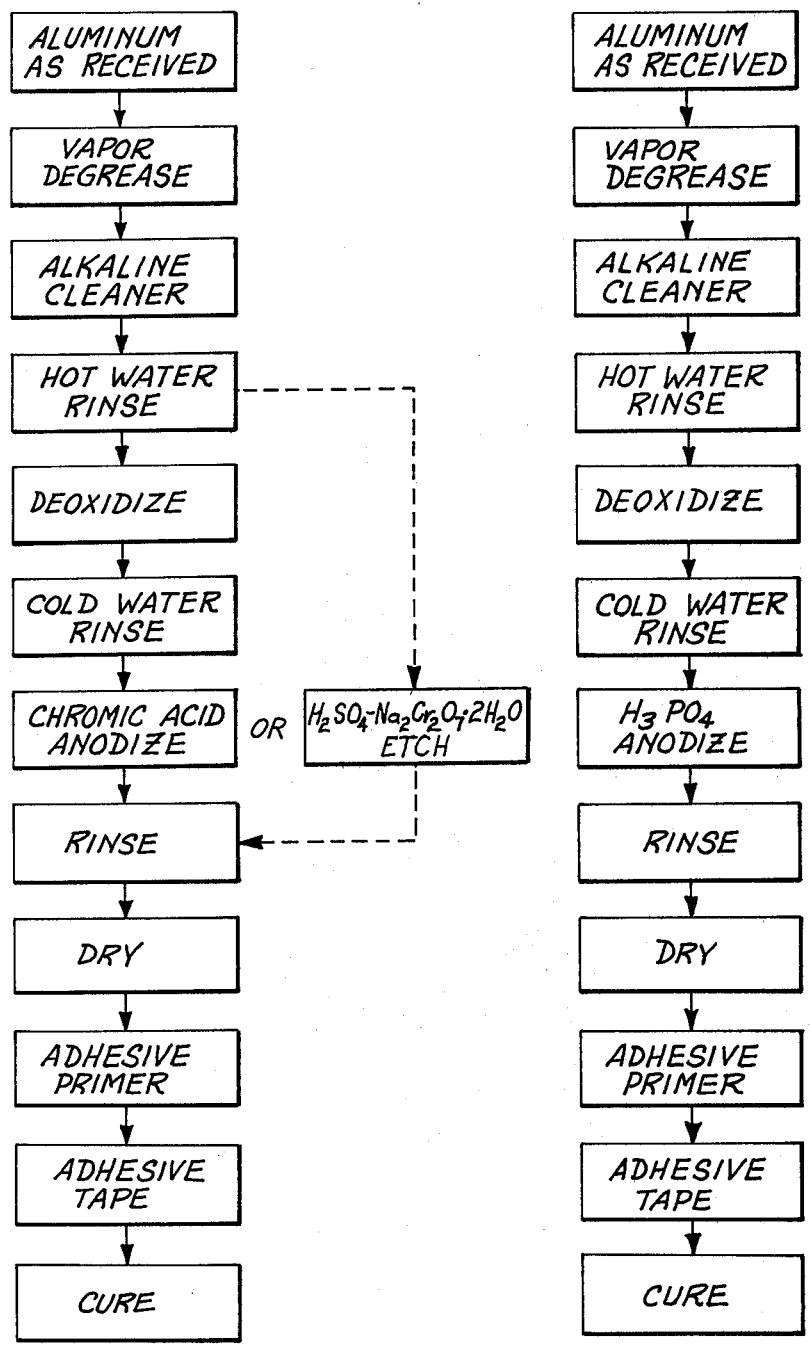
FIG. 1 is a schematic flow diagram of two widely used prior art processes for preparing aluminum surfaces for adhesive bonding.
FIG. 2 is a schematic flow diagram of the process of this invention.
Figure 5:
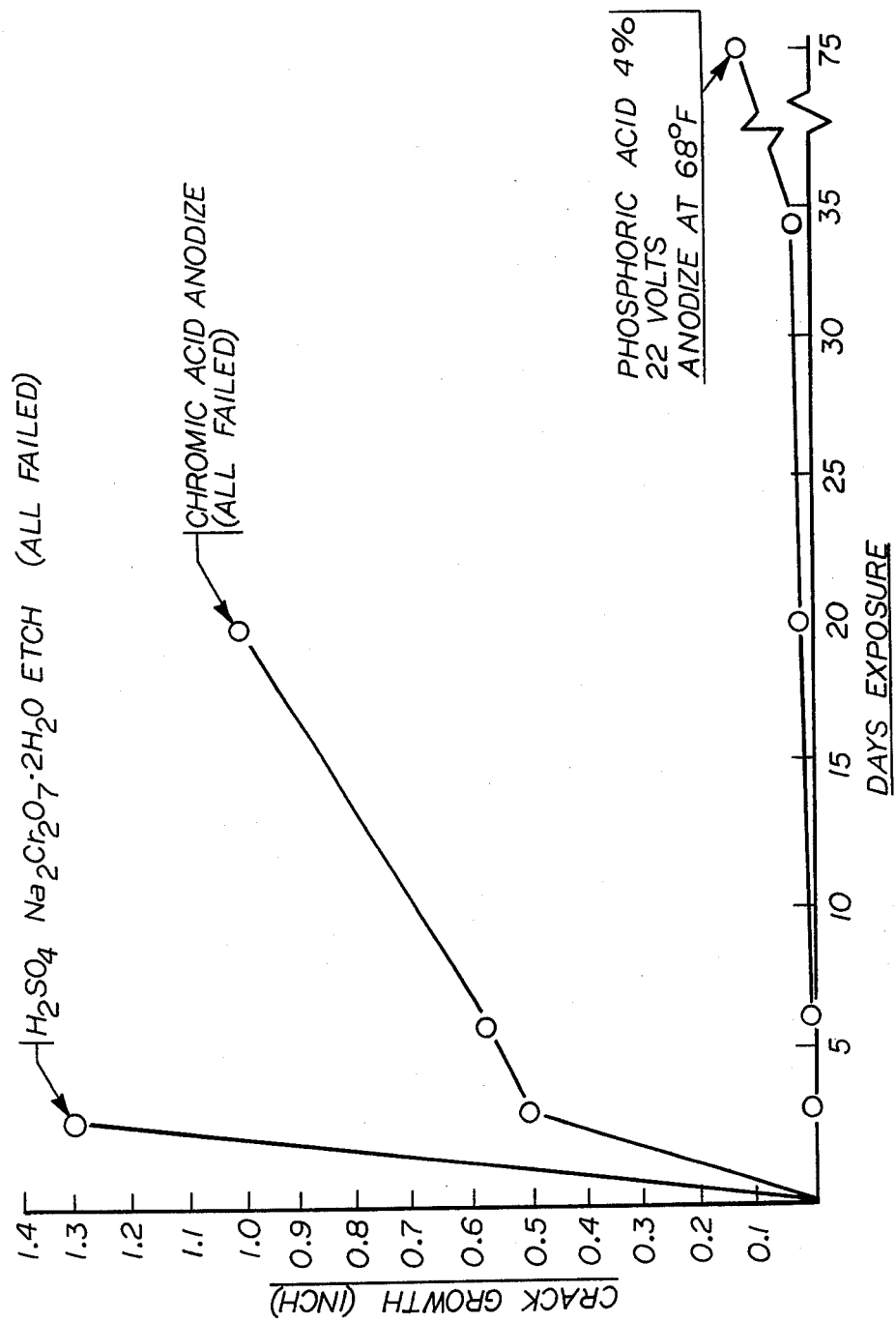
FIG. 5 is a graph showing crack propagation data for various bonded structures treated by prior art processes and by the process of this invention.
Figure 6:
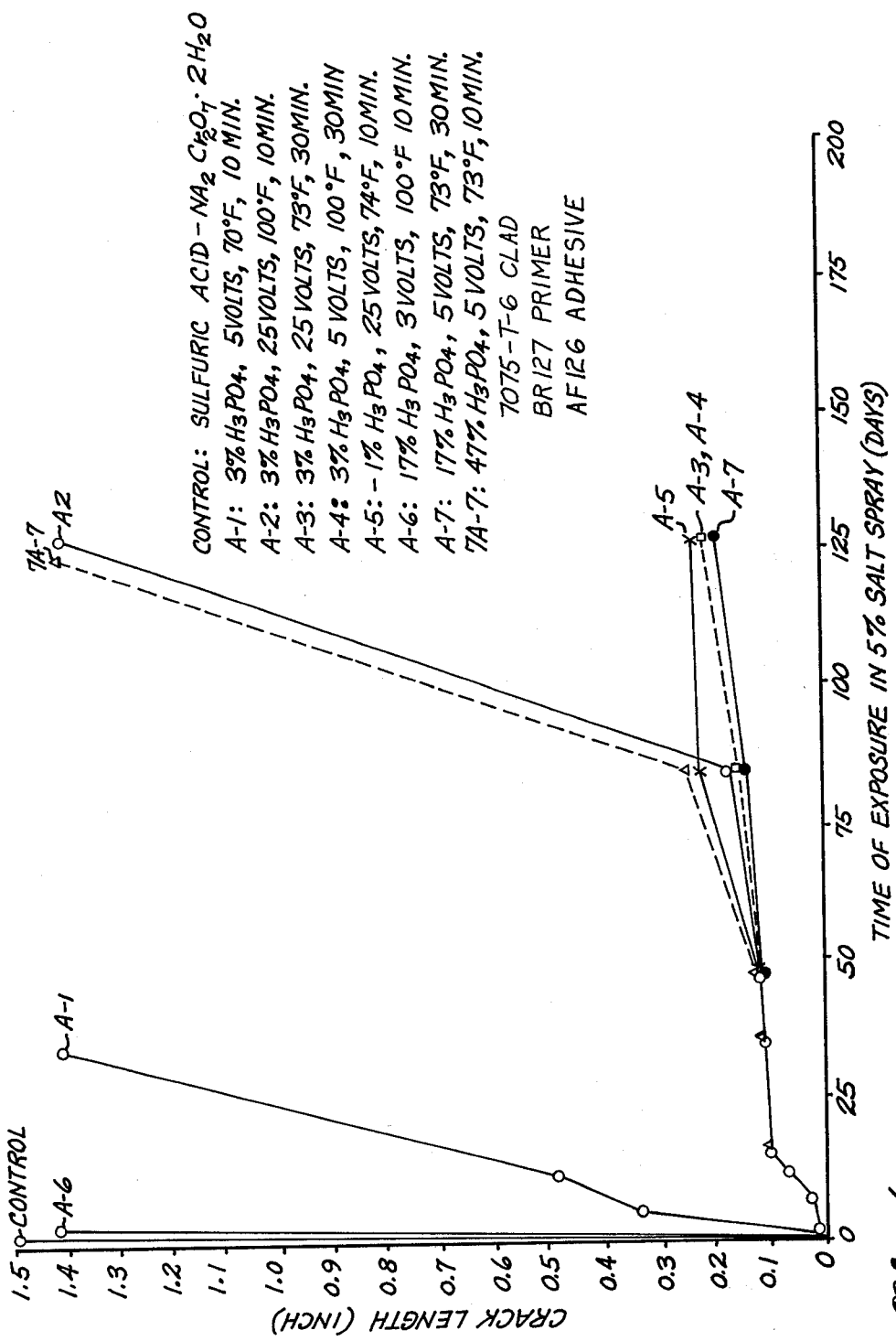
FIG. 6 is a graphical representation of test results of various bonded structures using prior art surface treatments and variations in the process taught herein.

Referring specifically to FIG. 1, two of the well known prior art processes are set forth in a step-by-step fashion in which aluminum material as received is first subjected to a degreasing and cleaning process in preparation for the surface treatment. The alkaline cleaner utilized is removed in a hot water rinse and the surface is then deoxidized by exposure to a suitable etchant such as sodium dichromate-sulfuric acid deoxidizer. One widely used deoxidizer or etchant for aluminum is sold by Amchem Products, Inc., Ambler, Pennsylvania, under the trade name "Amchem No. 6-16" to which nitric acid is added. A suitable etchant for aluminum at room temperature has the following composition: 4 to 9 percent by volume Amchem No. 6, 10 to 20 oz/gal nitric acid in an aqueous solution.

The aluminum is subjected to the above-noted solution at 65° to 90° F. for a period of time sufficient to deoxidize the surface of the aluminum.

In the event that the aluminum as received is reasonably clean and has a thin adherent oxide coating, the above-noted steps may be unnecessary prior to the anodization step.

After the surface has been deoxidized, if necessary, the surface is rinsed with cold water and then subjected to an acid anodization step utilizing chromic acid as the electrolyte. The chromic acid is suitably of a concentration of about 5% by weight chromic acid in water.

The aluminum surface is subjected to the anodization at 95° F. with an applied voltage in the range of 40 volts for a period of time sufficient to form an oxide coating of about 20,000 to about 30,000 Angstrom thickness. The chromic acid is rinsed from the surface of the aluminum and the aluminum surface is dried in preparation for the application of the adhesive materials.

Similarly when the sulfuric acid-sodium dichromate etch process is elected an aqueous solution containing about 4.1 to about 4.9 ounces of sodium dichromate dihydrate per gallon of solution and about 38.5 to 41.5 ounces $H_2SO_4$ per gallon is used. The etching process takes place at a temperature of about 140° F to 160° F.

A suitable epoxy or other primer is used such as a corrosion inhibiting epoxy primer designated as BR127 manufactured and sold by American Cyanamide Corporation. This epoxy primer is a 250° F. cure epoxy resin suitable as a corrosion inhibiting primer for the bare metal surfaces.

An adhesive material such as a modified epoxy resin having suitable curing characteristics is then applied to the primed aluminum surface. Several modified epoxy resins are readily available and are suitable for use in this invention including a product designated as FM123-2 manufactured and sold by the Bloomingdale Division of American Cyanamide; a product designated as AF126 modified epoxy resin having a 250° F. cure manufactured and sold by Minnesota Mining and Manufacturing Corporation and the modified epoxy adhesive designated as Hysol 9628 manufactured and sold by Hysol Division of Dexter Corporation. Many other resins are workable as adhesives for this invention. The primed and taped aluminum surfaces are then placed into engagement under pressure and cured at an elevated temperature to effect the joint or bond between the surfaces.

FIG. 2 shows a flow diagram of the process of this invention in which aluminum as received is subjected to similar cleaning and deoxidinzing steps as those outlined above for FIG. 1 if they are found to be necessary due to the condition of the aluminum surface. When the preliminary cleaning steps are completed, the aluminum surface is subjected to a low temperature anodization process in a solution of phosphoric acid. The following process parameters have been found to give exemplary results in the performance of the resulting bonded laminate in use:

TABLE I

| | Temperature ° F | Potential (Volts) | Time (Min.) | $H_3PO_4$ Concentration |
|---|---|---|---|---|
| Usable range | 50-100 | 1-50 | 5-60 | 1.5-50% |
| Preferred range | 60-95 | 3-25 | 10-30 | 3-20% |
| Aluminum Alloys | 50-80 | 3-25 | 10-30 | 3-20% |
| Pure Aluminum | 65-95 | 3-25 | 10-30 | 3-20% |
| Most preferred range | 75±10 | 10±1 | 20±5 | 10±2% |

Anodizing under the conditions set forth above consistently produces a surface superior in performance to that produced by conventional industry standard methods, i.e., chromic acid anodizing or sulfuric acid-sodium dichromate etch. This superior performance is clearly demonstrated by the bond stability test technique shown in FIGS. 7 and 8, and the resulting test data presented in FIGS. 3, 4, 5, 6 and 9.

EXAMPLE I

Comparative data for the aluminum surface preparation techniques shown in FIGS. 1 and 2 are presented in FIG. 3 for various epoxy resin adhesives used in preparation of a composite structure. All samples were prepared by cleaning as follows prior to anodizing:

(1) The surface was vapor degreased by exposure to trichloroethylene for 3 minutes at 190° F.

(2) The surfaces were then subjected to an alkaline cleaning agent such as Wyandotte Altrex, manufactured by Wyandotte Chemicals Corporation, Wyandotte, Michigan; Pennsalt A31, manufactured by Pennsalt Chemical Corporation of Philadelphia, Pennsylvania; or any of the other well-known equivalent aluminum cleaners available and known to the industry. The aluminum surface is exposed to the alkaline cleaner for a period of about 10 minutes.

(3) The aluminum surface is then rinsed with hot water for 5 minutes to remove the alkaline cleaning agent.

(4) A prebond etch in the sodium dichromate-sulfuric acid deoxidizer noted above for 10 minutes at 150° F.

(5) The surface is then immersed in cold tap water rinse for 5 minutes to remove the prebond etchant material.

One-half of the samples were then dried and primed with BR127, an epoxy corrosion resistant primer, 250° F. cure, manufactured by American Cyanamide. The remaining samples were subjected to an anodization in 3 percent phosphoric acid at 75° F. for 10 minutes with an imposed voltage of 5 volts. The surfaces were then washed with a water rinse, dried and primed with BR127 as noted above.

The 2 groups of samples were then divided into 3 subgroups each and coated with the following adhesive materials:

TABLE II

| Designation | Material |
|---|---|
| FM123-2 | Modified epoxy resin adhesive, 250° F. cure, manufactured by American Cyanamide, Bloomingdale Division. |

TABLE II-continued

| Designation | Material |
|---|---|
| AF 126 | Modified epoxy resin adhesive, 250° F. cure, manufactured by Minnesota Mining and Manufacturing. |
| Hysol 9628 | Modified epoxy resin adhesive, 250° F. cure, manufactured by Hysol Division, Dexter Corporation. |

Figure 8:
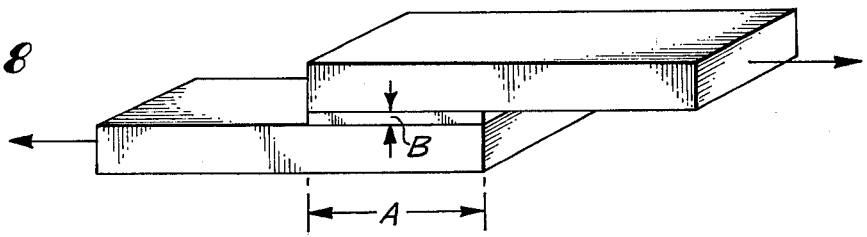
FIG. 8 is a graphical representation of the sustained stress lap shear test used in evaluating the bonded structures formed according to this invention.
Figure 9:
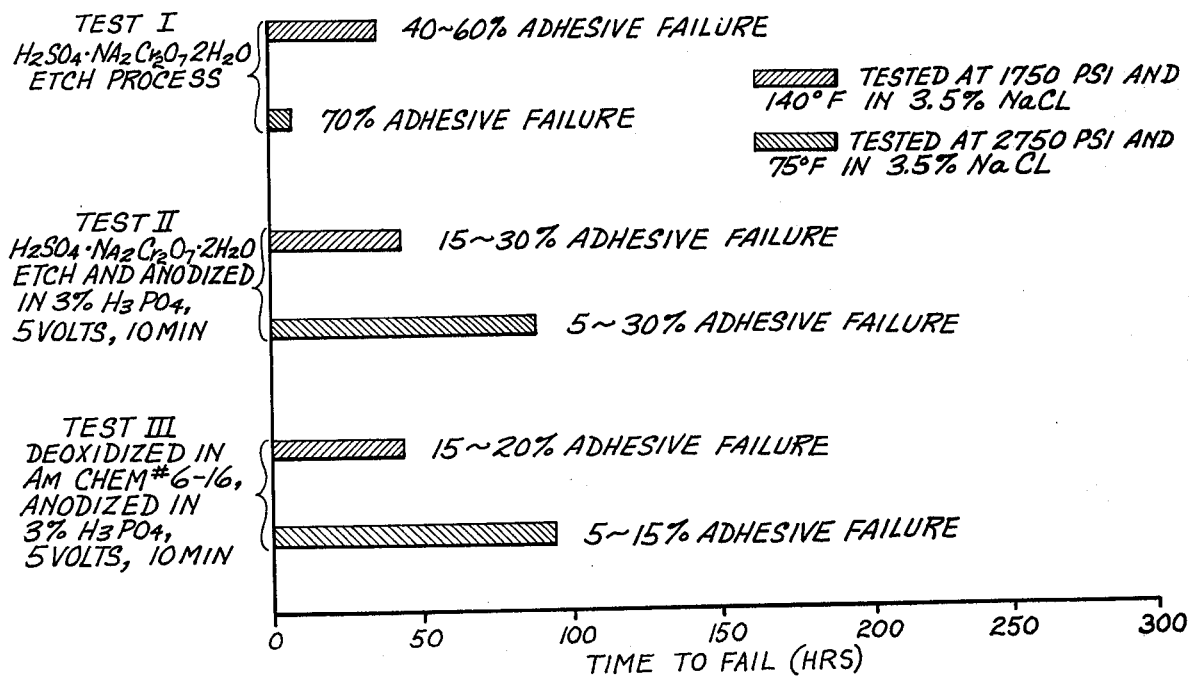
FIG. 9 is a graphical representation of test results comparing sustained stress lap shear test data for various methods of pretreatment of the aluminum surface and the resultant effect on adhesive versus cohesive failure.

The samples were then assembled in a form suitable for use in the test schematically shown in FIG. 8 and subjected to endwise stress of 1,750 psi while immersed in 3.5 percent sodium chloride solution at 140° F. In all cases the samples anodized in phosphoric acid presented substantially superior results to those prepared in the prior art process. Of particular interest is the nature of the failure, those samples prepared with the prior art process having predominantly adhesive failure at the interface between the adhesive and the metal, while those manufactured utilizing the process of this invention had substantially less adhesive failure, with the failure being predominantly cohesive in the resin itself.

EXAMPLE II

Test results for sustained stress lap shear tests at 2,750 psi while the sample was immersed in 3.5 percent sodium chloride at 75° F. are presented in FIG. 4 for samples prepared in a manner corresponding to those described above for FIG. 3. Specimens prepared by prior art etching process failed within one day of the start of the tests. Those samples prepared using a phosphoric acid anodization in 3% $H_3PO_4$ at 70° F for 10 minutes at 5 volts demonstrated superior resistance to failure. Four out of five specimens bonded with AF126 and all specimens bonded with Hysol 9628 survived 30 days test without failure.

EXAMPLE III

Figure 7:
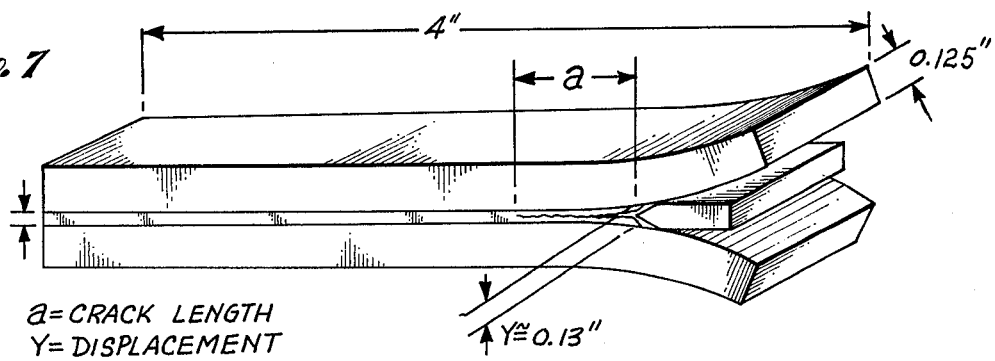
FIG. 7 is a schematic representation of the crack propagation test utilized in evaluating the laminates formed using the process of this invention.

Table III shows the results of 120° F., 100 percent relative humidity test for a test specimen prepared as shown in FIG. 7 and indicate the effect of solution temperature on bond stability for 8% and 12% phosphoric acid solutions. Excellent results were obtained indicating that less than three-tenths of an inch of crack growth was encountered for both 8 and 12 percent solutions after 60 days of exposure. Specimen F-1 and F-5 showed a higher degree of adhesive failure for anodization at 60° F. suggesting that 60° F. is a marginal temperature for the anodization process when the substrate is pure or nearly pure aluminum or clad aluminum.

EXAMPLE IV

In order to determine the optimum process condition, numerous samples of 7075-T6 aluminum clad panels, 6 inches square, having a thickness of 0.063 inches were prepared using a preanodization process in which the surfaces of the aluminum panels were exposed to a solution of Amchem 7-17 (a proprietary solution containing nitric acid sold by Amchem Products, Inc., Ambler, Pennsylvania). This solution is a room temperature etchant for aluminum. After surface etching with the Amchem 7-17 solution, 4 panels per condition noted in Table IV were anodized and prepared for bonding by spray rinsing the anodization solution from the surface and drying the surface at 140° F. for 10 minutes. BR127 primer was applied to the prepared surface and the panels were bonded with Hysol 9628. The epoxy was applied in a 10 mil thick layer. Ten 1-inch wide fracture specimens were saw cut from each pair of assemblies. Six specimens from each assembly were exposed to boiling water and the amount of crack growth was measured after 1, 4 and 24 hours for specimens prepared as shown in FIG. 7. The remaining 4 specimens were exposed to 5 percent salt spray at 90° F. and the amount of crack growth was measured. The test results are presented in Table V for the water boil test and Table VI for the 5 percent salt spray at 90° F. test.

The average crack propogation rate and failure mode of the specimens subjected to boiling water indicated less than eight-tenths inch of crack growth after 24 hours exposure. Some specimens that were anodized in 3 percent phosphoric acid at 65° F. for 10 minutes (see specimen A1 and A2) showed adhesive failures. All other failures were center-of-the-bond or cohesive.

The oxide coating weight varied from 15 $mg/ft^2$ to 47 $mg/ft^2$. No correlation between the coating weight and the bond stability was found.

The test results for the 5 percent salt spray at 95° F. crack growth data is shown in Table VI. Extended exposure to the salt environment induced failures of more anodized conditions than did the water boil test. However, since the adherent was clad aluminum alloy the cladding is sacrificial in a corrosive environment and is uncertain if these adhesive failure modes were the result of galvanic corrosion, less than optimum surface preparation or a combination of both.

EXAMPLE V

Variations of the anodization process parameters were explored and the results shown in Table VII. The initial room temperature lap shear strength was 5200 ±200 psi and the mode of failure 100 percent cohesive for all specimens. Under sustained stress of 1750 psi, most of the specimens failed in 20 $t$ 200 hours. The specimens prepared in 17 percent $H_3PO_4$ at 100° F. and 3 volts anodizing potential (Test A6) showed poor bond stability and failed in less than 23 hours with 40 to 50 percent cohesive failure. The processing conditions of this test would appear to cause excessive oxide dissolution during anodization and not permit the build-up of the desired type of oxide coating. The high temperature thus results in a poor oxide film formation and resultant poor bond performance.

Corresponding specimens to Test A6 when tested in a sustained stress/fracture test had complete separation of adhesive from the aluminum surface in less than 24 hours. The specimens of Test A1 failed after 22 days exposure and all of the test specimens prepared by processes A3, A4, and A7 showed excellent stability with less than two-tenths inch of crack growth after 125 days of salt spray exposure. These tests indicate that the process of this invention is capable of producing a stable bond surface using wide ranges of acid concentrations, potential and temperature. An upper and lower temperature range is shown at which decreasing bond performance results when temperatures in excess of about 95° F. are used and when temperatures below about 60° F. are used. The optimum parameters appear to be the following:

| | |
|---|---|
| Orthophosphoric acid | 10% by weight |
| Potential | 10 volts |
| Time | 20 minutes |

| | |
|---|---|
| -continued | |
| Temperature | 75° F. |

EXAMPLE VI

Samples of 2024-T3 bare aluminum alloy plate (an alloy containing about 4.5% copper, about 0.6% manganese and about 1.5% magnesium) were prepared for bonding in a 10% phosphoric acid anodization, using 10 volts potential for 20 minutes at 70° F. The surfaces were primed with BR127 and samples bonded together with AF126 epoxy resin. Identical specimens were prepared using the $H_2SO_4$-$Na_2Cr_2O_7$- $2H_2O$ etch discussed above. Both sets of samples were exposed to 5% salt spray at 95° F while the bond was placed under an initially high stress and maintained under stressed conditions for an extended period of time. At the end of 70 days the samples prepared with $H_2SO_4$-$Na_2O_7$-$2H_2O$ failed adhesively over the entire length of the stressed bond. The samples prepared using $H_3PO_4$ anodization exhibited no adhesive failure at the end of 18 months exposure. A cohesive failure crack extended about one half inch along the bond, exclusively with the adhesive material.

Various modifications and improvements can be made to the present invention without departing from the spirit thereof and from the scope of the claims set forth below.

We claim:

1. A method of preparing an adhesively bonded aluminum structure comprising
forming a porous columnar aluminum oxide coating on surfaces of aluminum alloy articles, said aluminum alloy articles containing about 1.6 to about 4.5% by weight copper by anodizing said articles in an aqueous solution comprising phosphoric acid, the anodizing potential being from about 3 to about 25 volts, the phosphoric acid concentration being about 3 to about 20% by weight and the temperature of said solution being from about 50° F. to about 85° F.;
rinsing said articles to remove said solution;
applying an adhesive to said surfaces; and
bonding said aluminum articles together to form said adhesively bonded structure.

2. The method of claim 1 wherein said alumimum alloy article consists of aluminum alloy 7075.

3. The method of claim 1 wherein said aluminum alloy article consists of aluminum alloy 2024.

4. The method of claim 1 wherein said temperature range is 75°±10° F.

5. The process of claim 1 wherein said porous oxide coating is primed with an epoxy resin primer prior to application of said adhesive.

6. A process for preparing an adhesively bonded structure of copper-containing aluminum alloy adherends wherein said adherends have a polymer receptive aluminum oxide surface thereon having a porous columnar structure with a thickness of from about 500 to about 600 Angstroms, having pores from about 300 to about 600 Angstroms in diameter and from about 400 to about 5000 Angstroms in depth extending into said oxide surface, said structure prepared by the steps of:
cleaning and deoxidizing said adherends;
anodizing said adherends in an aqueous phosphoric acid solution containing from about 3 to about 20% by weight $H_3PO_4$ at a temperature of from about 50 to about 85° F. for about 10 to about 30 minutes at a potential of about 3 to about 25 volts;
rinsing said adherends to remove said aqueous phosphoric acid solution;
applying an adhesive to the surface of at least one of said adherends; and
bonding said adherends together to form said structure.

7. The process of claim 6 wherein said adherends contain from about 1.6 to about 4.5% by weight copper.

8. The process of claim 6 wherein said adherends consist of aluminum alloy 2024.

9. The process of claim 6 wherein said adherends consist of aluminum alloy 7075.

10. The process of claim 6 wherein said temperature range is 75°±10° F.

11. The process of claim 6 wherein said temperature is about 70° F, said solution contains about 10% phosphoric acid, said potential is about 10 volts and said anodization time is about 20 minutes.

12. The process of claim 6 wherein said oxide surface is coated with an epoxy primer and adhered to another surface with an epoxy resin adhesive.

13. The process of claim 6 wherein said porous oxide coating is primed with an epoxy resin primer prior to application of said adhesive.

14. An adhesively bonded alumimum alloy structure formed by adhesively bonding together aluminum adherends containing from about 1.6 to about 4.5% by weight copper, said adherends each having a polymer receptive aluminum oxide surface thereon having a porous columnar structure with a thickness of from about 500 to about 6000 Angstroms, having pores from about 300 to about 600 Angstroms in diameter and from about 400 to about 5000 Angstroms in depth extending into said oxide surface, said structure prepared by anodizing the surfaces of said adherends in an aqueous phosphoric acid solution containing from about 3 to about 20% by weight $H_3PO_4$ at a temperature of from about 50° F. to about 85° F. for about 10 to about 30 minutes at a potential of from about 3 to about 25 volts, rinsing said adherends to remove said solution, applying a polymeric adhesive to said surfaces and bonding said adherends together.

15. The structure of claim 14 wherein said temperature range is 75±10° F.

16. The structure of claim 14 wherein said temperature is about 70° F., said solution contains about 10% by weight phosporic acid, said potential is about 10 volts and said anodization time is about 20 minutes.

17. The structure of claim 14 wherein said temperature is about 70° F., said solution contains about 10% by weight phosphoric acid, said potential is about 10 volts and said anodization time is about 20 minutes.

18. The process of claim 14 wherein said porous oxide coating is primed with an epoxy resin primer prior to application of said adhesive.

19. A method of preparing an adhesively bonded aluminum structure comprising:
forming a porous oxide coating on surfaces of aluminum articles, said oxide coating being a polymer receptive, substantially unhydrated aluminum oxide having a porous columnar structure with a thickness of from about 500 to about 6000 Angstroms, having pores from about 300 to about 600 Angstroms in diameter and from about 400 to about 5,000 Angstroms in depth extending into said oxide surface, by anodizing said articles in an aqueous acidic solution, the acid component thereof consisting essentially of phosphoric acid, the anodizing potential being from about 3 to about 25 volts, the phosphoric acid concentration being about 3 to about 20% by weight and the temperature of said solution being from about 50° F. to about 85° F.;

rinsing said articles to remove said solution;

applying an adhesive to said surfaces; and bonding said aluminum articles together to form said adhesively bonded structure.

20. The method of claim 19 wherein said temperature range is 75°±10° F.

21. The method of claim 19 wherein said potential is 10±1 volts.

22. The method of claim 19 wherein said phosphoric acid concentration is 10±2% by weight.

23. The method of claim 19 wherein said anodization is conducted for from 10 to 30 minutes.

24. The process of claim 19 wherein said porous oxide coating is primed with an epoxy resin primer prior to application of said adhesive.

25. An adhesively bonded structure formed by bonding together aluminum adherends, each adhered having a polymer receptive hydration-resistant, aluminum oxide surface thereon, said oxide surface having a porous columnar structure with a thickness of from about 500 to about 6,000 Angstroms, having pores from about 300 to about 600 Angstroms in diameter and from about 400 to about 5,000 Angstroms in depth extending into said oxide surface, said surface prepared by anodizing the surface of said adherend in an aqueous acidic electrolyte, the acidic component of said electrolyte consisting essentially of $H_3PO_4$ present in amounts from about 3 to about 20% by weight $H_3PO_4$ at a temperature of from about 60° F. to about 90° F. for about 10 to about 30 minutes at a potential of from about 3 to about 25 volts, rinsing said adherend to remove said solution, applying an adhesive to said surfaces and bonding said adherends together to form said adhesively bonded structure.

26. The structure of claim 25 wherein said temperature range is 75°±10° F.

27. The process of claim 25 wherein said porous oxide coating is primed with an epoxy resin primer prior to application of said adhesive.

28. A process for preparing an adhesively bonded aluminum structure from aluminum adherends comprising the steps of:

cleaning the surface of said adherends;

deoxidizing the surface of said adherends;

forming a porous aluminum oxide surface on said adherends by anodization of said adherends in an aqueous acidic solution, the acidic component thereof consisting essentially of phosphoric acid, the anodizing potential being from about 3 to about 25 volts, the phosphoric acid concentration being about 3 to about 20% by weight, the temperature of said solution being in the range of 75°±10° F.;

rinsing said adherends to remove said solution;

applying an epoxy resin primer to said porous aluminum oxide surface;

curing said primer;

applying an adhesive to at least one of said adherends; and bonding said adherends together to form said adhesively bonded aluminum structure.

29. The product produced by the process of claim 28.

* * * * *

UNITED STATES PATENT AND TRADEMARK OFFICE
CERTIFICATE OF CORRECTION

PATENT NO. : 4,085,012
DATED : April 18, 1978
INVENTOR(S) : J. Arthur Marceau et al.

It is certified that error appears in the above—identified patent and that said Letters Patent are hereby corrected as shown below:

Column 9, line 32: a colon —:— is inserted after "comprising".

Column 10, line 51: "14" is changed to —25—.

Column 11, line 23: "adhered" is changed to —adherend—

Signed and Sealed this

Nineteenth Day of September 1978

[SEAL]

*Attest:*

RUTH C. MASON
*Attesting Officer*

DONALD W. BANNER
*Commissioner of Patents and Trademarks*

UNITED STATES PATENT AND TRADEMARK OFFICE
CERTIFICATE OF CORRECTION

PATENT NO. : 4,085,012
DATED : April 18, 1978
INVENTOR(S) : J. Arthur Marceau et al.

It is certified that error appears in the above-identified patent and that said Letters Patent are hereby corrected as shown below:

Column 1, line 6: delete ", divisional".

*Signed and Sealed this*

*Thirty-first* Day of *October 1978*

[SEAL]

Attest:

RUTH C. MASON
*Attesting Officer*

DONALD W. BANNER
*Commissioner of Patents and Trademarks*